(12) United States Patent
James et al.

(10) Patent No.: US 11,130,874 B2
(45) Date of Patent: Sep. 28, 2021

(54) HYBRID PHOTOPOLYMER COMPOSITION FOR ADDITIVE MANUFACTURING

(71) Applicant: PERSTORP AB, Perstorp (SE)

(72) Inventors: David James, Lund (SE); Vanessa Maurin, Perstorp (SE); Pia Wennerberg, Lund (SE)

(73) Assignee: PERSTORP AB, Perstorp (SE)

( * ) Notice: Subject to any disclaimer, the term of this patent is extended or adjusted under 35 U.S.C. 154(b) by 0 days.

(21) Appl. No.: 16/954,632

(22) PCT Filed: Dec. 19, 2018

(86) PCT No.: PCT/SE2018/051345
§ 371 (c)(1),
(2) Date: Jun. 17, 2020

(87) PCT Pub. No.: WO2019/125296
PCT Pub. Date: Jun. 27, 2019

(65) Prior Publication Data
US 2020/0308426 A1    Oct. 1, 2020

(30) Foreign Application Priority Data

Dec. 19, 2017   (SE) .................................. 1730346-2

(51) Int. Cl.
| | | |
|---|---|---|
| *C08F 2/46* | (2006.01) | |
| *C08F 2/50* | (2006.01) | |
| *C08G 61/04* | (2006.01) | |
| *C09D 11/101* | (2014.01) | |
| *B33Y 70/00* | (2020.01) | |
| *C08F 222/10* | (2006.01) | |
| *C08G 59/24* | (2006.01) | |
| *C08G 59/68* | (2006.01) | |
| *C08G 65/18* | (2006.01) | |
| *C08L 63/00* | (2006.01) | |
| *C08L 67/04* | (2006.01) | |
| *C09D 11/104* | (2014.01) | |

(52) U.S. Cl.
CPC ............ *C09D 11/101* (2013.01); *B33Y 70/00* (2014.12); *C08F 222/103* (2020.02); *C08G 59/24* (2013.01); *C08G 59/688* (2013.01); *C08G 65/18* (2013.01); *C08L 63/00* (2013.01); *C08L 67/04* (2013.01); *C09D 11/104* (2013.01); *C08L 2205/05* (2013.01)

(58) Field of Classification Search
CPC ...... C08G 65/18; C08G 59/24; C08G 59/688; C08G 59/68; G03F 7/038; G03F 7/032; G03F 7/027; B33Y 70/00; B33Y 10/00; C09D 11/104; C09D 11/101; B29C 64/106; C08F 222/103; C08F 2/48; C08L 63/00; C08L 67/04; C08L 33/06; C08L 71/02; C08L 2205/05
USPC ............ 522/26, 7, 6, 1, 189, 184, 71; 520/1
See application file for complete search history.

(56) References Cited

U.S. PATENT DOCUMENTS

| | | | |
|---|---|---|---|
| 2010/0119835 A1 | 5/2010 | Messe et al. | |
| 2010/0304100 A1 | 12/2010 | Fong | |
| 2015/0044623 A1* | 2/2015 | Rundlett | ................ C08G 59/24 |
| | | | 433/6 |
| 2016/0152846 A1 | 6/2016 | Carter et al. | |
| 2016/0159009 A1* | 6/2016 | Canale | ................... B33Y 10/00 |
| | | | 264/401 |

FOREIGN PATENT DOCUMENTS

| | | | |
|---|---|---|---|
| EP | 1893704 A1 | 3/2008 | |
| JP | 2010265408 A | 11/2010 | |
| WO | WO-2014058042 A1 * | 4/2014 | .............. C08L 67/06 |

OTHER PUBLICATIONS

Inata et al., WO 2014/058042 Machine Translation, 417-2014 (Year: 2014).*
International Search Report and Written Opinion dated Mar. 8, 2019 for corresponding PCT Application No. PCT/SE2018/051345.

* cited by examiner

*Primary Examiner* — Jessica Whiteley
(74) *Attorney, Agent, or Firm* — Polsinelli PC

(57) ABSTRACT

The present invention refers to a hybrid photopolymer composition for additive manufacturing, —comprising 50-95% by weight of a free radically curable-component, farther comprising at least one (meth)acrylate monomer or oligomer, 5-49% by weight of a cationically curable component, further comprising a cycloaliphatic epoxide, an oxetane mixture, containing a monooxetane compound and a polyoxetane compound, and a thermoplastic polycaprolactone with a molecular weight of 20,000-100,000 g/mol, a free radical photoinitiator, a UV blocker, a cationic photoinitiator, optionally a cationic photosensitiser, and optionally a thermal initiator, wherein the percent by weight is based on the total weight of the photopolymer' composition. The invention also relates to the use of a photopolymer composition according to the present invention for producing a three-dimensional object through additive manufacturing and to a three-dimensional object obtained through additive manufacturing using the photopolymer composition—according the present invention.

20 Claims, No Drawings

HYBRID PHOTOPOLYMER COMPOSITION FOR ADDITIVE MANUFACTURING

CROSS-REFERENCE TO RELATED APPLICATIONS

This application is a national stage application (under 35 U.S.C. § 371) of PCT/SE2018/051345, filed Dec. 19, 2018, which claims benefit of Swedish Application No. 1730346-2, filed Dec. 19, 2017, which are incorporated herein by reference in their entireties.

FIELD OF THE INVENTION

The present invention refers to a hybrid photopolymer composition for additive manufacturing, comprising 50-95% by weight of a free radically curable component, 5-49% by weight of a cationically curable component, comprising a cycloaliphatic epoxide, an oxetane mixture, a thermoplastic polycaprolactone, a free radical photoinitiator, a UV blocker, a cationic photoinitiator, optionally a cationic photosensitiser and optionally a thermal initiator. The present invention further refers to the use of a photopolymer composition according to the present invention for producing a three-dimensional object through additive manufacturing and to a three-dimensional object obtained through additive manufacturing using the photopolymer composition according the present invention.

BACKGROUND OF THE INVENTION

Additive manufacturing is a process that makes three-dimensional objects layer by layer based on computer-aided design (CAD) models. There are several different printing techniques of which the most commonly used are fused deposition modelling (FDM), selective laser sintering (SLS), inkjet 3D printing, stereolithography (SLA) and 3D plotting. Each technique has its own advantages and limitations in producing three-dimensional products. The selection of fabrication technique depends on the starting materials, requirements of processing speed and resolution, costs and performance requirements of final products. The largest market segment of additive manufacturing materials are photopolymers, i.e. polymers that change their physical properties when exposed to light.

Photopolymers are essential for additive manufacturing processes using photopolymerisation, such as SLA and DLP (digital light processing). Examples of radiation that may be used to cure commercial photopolymers are gamma rays, X-rays, electron beams, UV, and visible light. In additive manufacturing UV and visible light are most commonly used radiations. The light source could be a laser, a lamp, a projector or light-emitting diodes (LEDs). Unlike the thermoplastics used in additive manufacturing based on material extrusion technologies, like FDM, photopolymers are thermosets, once the chemical reaction takes place to harden the material, it cannot be remelted. Key elements necessary for the photopolymerisation process are photoinitiators and photocurable oligomers and/or monomers, but photopolymers may also include a number of other ingredients, such as plasticizers and colorants.

The technology of photopolymer additive manufacturing was introduced and commercialized in 1986 along with the first SLA machine. At that time there was only one usable photopolymer with poor physical properties and major distortion of the printed art. In the early 1990s the first "hybrid" photopolymer formulations, i.e. formulations with both cationically curable and free radical curable compounds, were introduced and photopolymers started to be used to a larger extent. The photopolymers often had similar tensile strength and flexural modulus as thermoplastics, but they could not match thermoplastics in the areas of impact resistance and long-life physical properties. Over time, the properties of photopolymers have been further improved to more closely match those of injection-molded thermoplastics.

Additive manufacturing has received an exceptional attention and interest in recent years from both industry and researchers. Since additive manufacturing provides almost endless possibilities for rapid prototyping it has found applications in many research fields such as mechanical engineering, medicine, materials science and chemistry. The number of applications for additive manufacturing is increasing all the time as the processes are developed and improved. Most additive manufactured polymer products are still used as conceptual prototypes rather than functional components, since polymer products produced by additive manufacturing are not strong enough. In order to widen the industrial application of additive manufactured polymers their mechanical properties have to be enhanced even further.

Photopolymer compositions used in additive manufacturing systems need to have a combination of desirable properties. Preferably such compositions should have little or no surface tackiness after curing, a combination of high temperature resistance, low humidity sensitivity and good mechanical properties such as high strength, high impact resistance along with high flexural modulus and tensile modulus. A competitive photopolymer composition further needs to cure fast and thoroughly, be compatible with the desired post processing and not yellow after a while. While existing hybrid photopolymer compositions are suitable for making three-dimensional articles with additive manufacturing systems, there is still a need for better compositions with improved physical properties. Especially the heat deflection temperature (HDT), impact resistance, tensile strength and durability of the photopolymers need to be improved in order to be able to create objects through additive manufacturing with properties similar to injection molding.

Several attempts have been made in the prior art to improve the mechanical properties of the photopolymers. For instance the patent application WO 2008/110512 discloses a clear, low viscosity cationic curable composition comprising an epoxy, an oxetane, a polyol having a molecular weight Mw of 2000 g/mol and higher and a cationic photoinitiator, which, upon cure in a SLA process, produces an opaque object having the look and feel of ABS (acrylonitrile butadiene-styrene) material.

WO 2010/088323 discloses a liquid hybrid radiation curable composition including a cationically polymerizing alicyclic epoxide having at least two epoxy groups, at least one cationic photoinitiator at least one free radical photoinitiator, and at least one dendritic polymer having either at least six hydroxyl functional groups or at least six (meth)acrylate functional groups. The patent application alleges to have a composition of very high impact resistance, it is however not comparable with the impact resistance of the present invention.

The patent application WO 2006/098676 discloses a UV curable composition comprising at least one cycloaliphatic epoxy or epoxide, vinyl ether, and/or oxetane or a mixture thereof, at least one polycarbonate diol, triol and/or polyol and at least one cationic photoinitiator and optionally at least one radically polymeriserable monomer or oligomer and/or a mixture thereof and/or at least one free radical photoinitiator. The high hydrophobicity makes the polycarbonate diol, triol and/or polyol suitable in stable photopolymer compositions for additive manufacturing.

In the previous state of the art, there is no specific mention of examples of mixed oxetanes in photopolymer hybrids which allow the incorporation of thermoplastic polycaprolactone in order to increase impact resistance of the additive manufactured object. On the contrary it is described in for instance patent application WO 2008/110512 that traditional tougheners can usually not be used in effective amounts due to increases in viscosity.

It is known to a person skilled in the art that the use of polyols of high molecular weight as flexibilisers and tougheners usually results in an increased viscosity of the final composition. Due to the increased viscosity, the addition of high molecular weight polyols to a photopolymer composition has not been possible when using standard SLA or DLP printers. There is ongoing development work in constructing new printers that are able to print more viscous photopolymer compositions.

An object of the present invention is to provide a hybrid photopolymer composition which, upon cure in a standard SLA or DLP printer, produces a three-dimensional object having excellent mechanical properties, including a high impact strength, which can be used in various applications.

SUMMARY OF THE INVENTION

The present invention refers to a hybrid photopolymer composition containing 50-95% by weight of a free radically curable component, comprising at least one (meth)acrylate monomer or oligomer, 5-49% by weight of a cationically curable component, comprising a cycloaliphatic epoxide, an oxetane mixture, containing a monooxetane and a polyoxetane, and a thermoplastic polycaprolactone, a free radical photoinitiator, a UV blocker, a cationic photoinitiator, optionally a cationic photosensitiser, and optionally a thermal initiator, where the percent by weight is based on the total weight of the photopolymer composition. The thermal initiator might be added to the hybrid photopolymer composition in order to complete the curing of the printed object in a thermal post-curing step.

It has surprisingly been found that the specific combination of the components of the present invention results in a photopolymer composition with a viscosity low enough to be used in a standard SLA or DLP printer and with the ability to yield a three-dimensional object with excellent mechanical properties, especially a high impact strength.

The use of caprolactone polyols as being a "toughener" is known in the art, but higher molecular weight is needed to increase the impact resistance of an additive manufactured object. The addition of a high molecular weight compound increases the viscosity and makes additive manufacturing through SLA or DLP very difficult, if not impossible. We have now found a way to overcome the problem with increased viscosity. By adding a small amount of thermoplastic polycaprolactone with a molecular weight in the range of 20000-100000 g/mol to the cationic curable component of the photopolymer composition, the impact strength of the additive manufactured object is substantially improved. The presence of a mixture of monooxetane and polyoxetane in the composition has shown to be crucial for reaching an acceptable viscosity of the photopolymer composition and a great impact resistance of the cured three-dimensional object produced through SLA or DLP printing of the photopolymer composition of the invention.

The impact strength of a cured three-dimensional object produced through SLA or DLP printing of the photopolymer composition of the present invention, is even further increased by a specific ratio of monooxetane to polyoxetane present in the cationic compound of the photopolymer composition of the present invention. The polyoxetane has further the ability to increase the curing speed and the presence of monooxetane also increases the flexibility of the cured product.

DETAILED DESCRIPTION OF THE INVENTION

The present invention refers to a hybrid photopolymer composition for additive manufacturing, comprising:
  a) 50-95% by weight of a free radically curable component, further comprising at least one (meth)acrylate monomer or oligomer,
  b) 5-49% by weight of a cationically curable component, further comprising
    b1) a cycloaliphatic epoxide,
    b2) an oxetane mixture, containing
      i. a monooxetane compound, having one oxetane group, and
      ii. a polyoxetane compound, having at least two oxetane groups, and
    b3) a thermoplastic polycaprolactone with a molecular weight of 20,000-100,000 g/mol,
  c) a free radical photoinitiator,
  d) a UV blocker,
  e) a cationic photoinitiator, optionally
  f) a cationic photosensitiser, and optionally
  g) a thermal initiator,
wherein the percent by weight is based on the total weight of the photopolymer composition. The molecular weight given for the compounds of the claimed composition is the weight average molecular weight Mw.

It has surprisingly been found that the specific combination of the components (a) to (g) of the present invention results in a photopolymer composition with a viscosity low enough to be used in a standard SLA or DLP printer and with the ability to yield a three-dimensional object with excellent mechanical properties, especially a high impact strength. The photopolymer composition of the present invention is preferably used in a SLA DLP process, but it may also be used in other photopolymer additive manufacturing techniques like three-dimensional jet printing to produce a three dimensional article having excellent mechanical properties.

The photopolymer composition of the present invention comprises 50-95% by weight of a free radically curable compound a), preferably 75-95% by weight and most preferably 85-95% by weight based on the total weight of the photopolymer composition. This free radically curable compound further comprises at least one (meth)acrylate monomer or oligomer. (Meth)acrylate refers to an acrylate, a methacrylate, or a mixture thereof. The (meth)acrylate monomer or oligomer preferably includes ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, trimethylolpropane tri(meth)acrylate, alkylene oxide, such as ethylene and/or propylene oxide, modified trimethylolpropane tri(meth)acrylate, tripropylene glycol di(meth)acrylate, neopentyl glycol di(meth)acrylate, alkylene oxide modified neopentyl glycol di(meth)acrylate, such as ethylene oxide modified neopentyl glycol di(meth)acrylate and propylene oxide modified neopentyl glycol di(meth)acrylate, (meth)

acrylic adducts of bisphenol A diglycidyl ether, 1,4-butanediol di(meth)acrylate, 1,6-hexanediol di(meth)acrylate, pentaerythritol tri(meth)acrylate, pentaerythritol tetra(meth)acrylate, alkylene oxide, such as ethylene oxide and/or propylene oxide, modified pentaerythritol tri(meth)acrylate and tetra(meth)acrylate, polyethylene glycol di(meth)acrylate, dipentaerythritol hexa(meth)acrylate, dipentaerythritol penta(meth)acrylate, dipentaerythritol tetra(meth)acrylate, alkylene oxide, such as ethylene and/or propylene oxide modified dipentaerythritol hexa(meth)acrylate, penta(meth)acrylate and tetra(meth)acrylate, ditrimethylolpropane di(meth)acrylate, tri(meth)acrylate, tetra(meth)acrylate, alkylene oxide, such as ethylene oxide and/or propylene oxide, modified ditrimethylolpropane tetra(meth)acrylate, alkylene oxide, such as ethylene and/or propylene oxide, modified bisphenol A, hydrogenated bisphenol A and bisphenol F di(meth)acrylate, (meth)acrylates of phenolic novolak polyglycidyl ethers and the like. Most preferably the free radically curable compound comprises an ethoxylated trimethylolpropane triacrylate (e.g. SR 454 from Sartomer (Arkema group)) and/or an aliphatic urethane triacrylate oligomer (e.g. EBECRYL 265 from Allnex or CN998B80 from Sartomer (Arkema group)). It has been noticed that the addition of pentaerythritol (meth)acrylate and dipentaerythritol (meth)acrylate has an improving effect on the additive manufacturing process. The build-up of the printing object is enhanced, the post-curing time is lowered and the details of the printed object are finer when certain amounts of pentaerythritol (meth)acrylate (e.g. pentaerythritol tetraacrylate) and dipentaerythritol (meth)acrylate (e.g. dipentaerythritol hexaacrylate) are present in the formulation.

In one embodiment of the present invention the free radically curable component a) of the photopolymer composition additionally comprises a 2-hydroxy-3-butenoic acid and/or at least one ester of 2-hydroxy-3-butenoic acid, as disclosed in patent application WO 2017/131563, which is hereby incorporated by reference. Said 2-hydroxy-3-butenoic acid and/or at least one ester of 2-hydroxy-3-butenoic acid is preferably present in an amount of 0-5% by weight, more preferably 0-2.5% by weight, based on the total weight of the photopolymer composition. Said ester of 2-hydroxy-3-butenoic acid is preferably a methyl or ethyl ester, like methyl vinyl glycolate or ethyl vinyl glycolate. The presence a 2-hydroxy-3-butenoic acid and/or an ester of 2-hydroxy-3-butenoic acid (e.g. methyl vinyl glycolate) has shown to decrease the viscosity of the photopolymer composition and contribute to a great build-up of the three-dimensional objects, flexible printed objects with really fine details, low colour and enhanced mechanical properties, like tensile strength and elongation at break.

In another embodiment of the present invention the free radically curable component a) of the photopolymer composition additionally comprises a urethane of a 2-hydroxy-3-butenoic acid and/or an ester of 2-hydroxy-3-butenoic acid, i.e. an oligomer or polymer obtained by reacting at least one monomeric, oligomeric or polymeric isocyanate having two or more isocyanate groups with 2-hydroxy-3-butenoic acid and/or at least one alkyl ester of 2-hydroxy-3-butenoic acid, as disclosed in patent application PCT/SE2018/050867, which is hereby incorporated by reference. The addition of a urethane of a 2-hydroxy-3-butenoic acid and/or an ester of 2-hydroxy-3-butenoic acid makes it possible to obtain really fine detailed three-dimensional objects with good mechanical properties. Said ester of 2-hydroxy-3-butenoic acid is preferably a methyl or ethyl ester, like methyl vinyl glycolate or ethyl vinyl glycolate.

The photopolymer composition of the present invention comprises 5-49% by weight of a cationically curable component b), preferably 5-25% by weight and most preferably 5-15% by weight based on the total weight of the photopolymer composition. This cationically curable component further comprises a cycloaliphatic epoxide b1) that is present in an amount of 65-85% by weight based on the weight of the cationically curable component b). Preferably the cycloaliphatic epoxide is a difunctional non-glycidyl epoxide compound in which the epoxide groups form part of an alicyclic or heterocyclic ringsystem: bis(2,3-epoxycyclopentyl) ether, 1,2-bis(2,3-epoxycyclopentyloxy)ethane, 3,4-epoxycyclohexyl-methyl 3,4-epoxycyclohexane-carboylate, 3,4-epoxy-6-methyl-cyclohexyethylmethyl 3,4-epoxy-6-methylcyclohexane-carboxylate, di(1,4-epoxycyclohexylmethyl)hexanedioate, di(3,4-epoxy-6-methylcyclohexylmethyl) hexanedioate, ethylenebis(3,4-epoxycyclohexanecarboxylate, ethanediol di(3,4-epoxycyclohexylmethyl)ether, vinylcyclohexenedioxide, dicyclopentadiene diepoxide or 2-(3,4-epoxycyclohexyl-5,5-spiro-3,4-epoxy)cyclohexane-1,3-dioxane, and 2,2'-bis-(3,4-epoxy-cyclohexyl)-propane. Highly preferred cycloaliphatic epoxides include cycloaliphatic difunctional non-glycidyl epoxies, such, as 3,4-epoxycyclohexyl-methyl 3',4'-epoxycyclohexanecarboxylate and 2,2'-bis-(3,4-epoxycyclohexyl)-propane, with the former being most preferred. In another embodiment, the epoxy-containing compound is a polyglycidyl ether, poly(3-methylglycidyl) ether, polyglycidyl ester or poly(3-methylglycidyl) ester.

Acrylates polymerize radically, while epoxides polymerize cationically. In the presence of each other during the curing process, an interpenetrating polymer network (IPN) of the two polymers is formed, a polymer blend rather than a copolymer. Although the acrylate and epoxide react independently they affect each other physically during the curing process. As a result, the acrylate polymerizes more extensively in the presence of epoxy and the acrylate is less sensitive to oxygen. The acrylate/epoxide hybrid system requires a shorter exposure time to be cured than either of the two taken separately. The acrylate and the epoxide benefit from each other by a synergistic effect. Increasing the acrylate content increases the cure speed but decreases the adhesion characteristics and increases the brittleness, while increasing the epoxy content reduces the shrinkage of curing, allows significant dark curing and improves the adhesion, but decreases the cure speed. In commercial hybrid photopolymer (acrylate/epoxide) systems for additive manufacturing, the epoxide content is usually higher than the acrylate content in order to reach good physical properties but to the price of a slow curing speed. With a photopolymer composition according to the present invention it is now possible to have a high acrylate content and cure at a high speed without the cured product being brittle, i.e. with a great impact resistance of the additive manufactured product.

The cationically curable component b) of the photopolymer composition of the present invention further comprises an oxetane mixture b2), containing a monooxetane compound (i), having one oxetane group, and a polyoxetane compound (ii), having at least two oxetane groups. This oxetane mixture b2) is present in an amount of 10-20% by weight based on the weight of the cationically curable component b). The monooxetane (i) is present in an amount of 50-99% by weight, preferably 70-80% by weight and most preferably 75% by weight based on the weight of the oxetane mixture b2). The polyoxetane (ii) is present in an amount of 1-50% by weight, preferably 20-30% by weight and most preferably 25% by weight based on the weight of the oxetane mixture b2). In other words the ratio of monooxetane (i) to polyoxetane (ii) is preferably 3:1.

Examples of preferred monooxetanes (i) are 3-ethyl-3-hydroxymethyloxetane, 3-(meth)allyl-oxymethyl-3-ethyl-oxetane, (3-ethyl-3-oxetanylmethoxy)-methylbenzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl(3-ethyl-3-oxetanylmethyl)ether, isobomyloxyethyl(3-ethyl-3-oxetanylmethyl)-ether, isobomyl(3-ethyl-3-oxetanylmethyl)ether, 2-ethylhexyl(3-ethyl-3-oxetanylmethyl)ether, ethyldiethylene glycol-(3-ethyl-3-oxetanylmethyl)ether, dicyclopentadiene(3-ethyl-3-oxetanyl-methyl)ether, dicyclo-pentenyloxyethyl(3-ethyl-3-oxetanylmethyl)ether, dicyclopentenyl(3-ethyl-3-oxetanylmethyl)ether, tetrahydrofurfuryl(3-ethyl-3-oxetanylmethyl) ether, tetrabromophenyl(3-ethyl-3-oxetanylmethyl)ether, 2-tetrabromophenoxyethyl(3-ethyl-3-oxetanylmethyl)ether, tribromo-phenyl(3-ethyl-3-oxetanylmethyl)ether, 2-tribromophenoxyethyl(3-ethyl-3-oxetanylmethyl)-ether, 2-hydroxyethyl(3-ethyl-3-oxetanylmethyl)ether, 2-hydroxypropyl(3-ethyl-3-oxetanyl-methyl)ether, butoxyethyl(3-ethyl-3-oxetanylmethyl)ether, pentachlorophenyl(3-ethyl-3-oxetanylmethyl)ether, pentabromo-phenyl(3-ethyl-3-oxetanylmethyl)ether, bomyl(3-ethyl-3-oxetanylmethyl) ether and the like. Other examples of oxetane compounds suitable for use include trimethylene oxide, 3,3-dimethyloxetane, 3,3-dichloromethyloxetane, 3,3-[1,4-phenylene-bis(methylene-oxymethylene)]-bis(3-ethyloxetane), 3-ethyl-3-hydroxymethyl-oxetane, and bis-[(1-ethyl(3-oxetanyl) methyl]ether.

Examples of polyoxetane compounds (ii) which may be used in the present invention include: 3,7-bis(3-oxetanyl)-5-oxa-nonane, 3,3'-(1,3-(2-methylenyl)propanediylbis(oxymethylene))-bis-(3-ethyloxetane), 1,4-bis[(3-ethyl-3-oxetanyl-methoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3oxetanyl-methyl)ether, triethylene glycol bis(3-ethyl-3-oxetanylmethyl)ether, tetraethylene glycol bis(3-ethyl-3-oxetanylmethyl)ether, tricyclodecanediyldimethylene(3-ethyl-3-oxetanylmethyl)-ether, triethylolpropane tris(3-ethyl-3-oxetanylmethyl)ether, 1,4-bis(3-ethyl-3-oxetanyl-methoxy)butane, 1,6-bis(3-ethyl-3-oxetanylmethoxy) hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanyl-methyl)ether, dipentaerythritol hexakis(3-ethyl-3-oxetanyl-methyl)ether, dipentaerythritol pentakis(3-ethyl-3-oxetanylmethyl)ether, dipentaerythritol tetrakis(3-ethyl-3-oxetanyl-methyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, ethylene oxide modified bisphenol-A-bis(3-ethyl-3-oxetanylmethyl) ether, propylene oxide modified bisphenol-A-bis(3-ethyl-3-oxetanylmethyl)ether, ethylene oxide modified hydrogenated bisphenol-A-bis(3-ethyl-3-oxetanylmethyl)ether, propylene oxide modified hydrogenated bisphenol-A-bis(3-ethyl-3-oxetanylmethyl)ether, ethylene oxide modified bisphenol-F-(3-ethyl-3-oxetanyl-methyl)ether, and the like.

The polyoxetane compound has at least two oxetane groups, preferably 1-4, and most preferably 2 oxetane groups. In particularly preferred embodiments of the present invention the monooxetane (i) is 3-ethyl-3-hydroxymethyl-oxetane (e.g. Curalite™Ox from Perstorp AB) and the polyoxetane (ii) is 3,3'-oxydimethylene-bis(3-ethyl-oxetane (e.g, Curalite™OxPlus from Perstorp AB).

The thermoplastic polycaprolactone b3) of the canonically curable component b) of the photopolymer composition of the present invention has a molecular weight of 20 000-100 000 g/mol and is present in an amount of 1-10% by weight, preferably 2.5-7.5% by weight based on the weight of the cationically curable component b). The thermoplastic polycaprolactone is selected from the group of linear polyesters of caprolactone monomer with a molecular weight of 25 000, 50 000, 80 000 and 100 000 g/mol. Preferred thermoplastic polycaprolactones are high molecular weight linear polyesters derived from caprolactone monomer, for instance Capa™ 6250, with a molecular weight of approximately 25 000 g/mol, Capa™ 6500 with a molecular weight of approximately 50 000 g/mol and Capa™ 6800 with a molecular weight of approximately 80 000 g/mol. The high molecular weight polycaprolactone might be in pellets or powder form, with the particle size of 100-1000 μm, in order to reduce time preparation and facilitate the dissolution in the cationic compound of the photopolymer composition of the present invention. A suitable polycaprolactone in powder form is for instance Capa™ 6506, with a molecular weight of approximately 50 000 g/mol and a particle size of 500-600 μm.

It was surprisingly found that the addition of an oxetane mixture b2) containing both mono- and polyoxetane, enhanced the solubility of the thermoplastic polycaprolactone b3) in the cationically curable compound and decreased the viscosity of the photopolymer composition. With the specific composition of the photopolymer composition of the present invention it is possible to print a three-dimensional object having excellent mechanical properties on a standard SLA or DLP printer.

In order to increase the strength of the additive manufactured three-dimensional object even further the photopolymer of the present invention may comprise graphene, present in an amount of 0-5% by weight based on the total weight of the photopolymer composition. Graphene is preferably added as graphene oxide particles dispersed in a solvent. The addition of graphene oxide to the photopolymer composition really increases the tensile strength, the elongation and the impact strength of the additive manufactured object.

The photopolymer composition of the present invention comprises at least one free radical photoinitiator c), in an amount of 0.1-5% by weight, preferably 0.1-2% by weight based on the total weight of the photopolymer composition. The free radical photoinitiator may be chosen from those commonly used to initiate radical photopolymerization. Examples of such photoinitiators include benzoins, e.g., benzoin, benzoin ethers such as benzoin methyl ether, benzoin ethyl ether, benzoin isopropylether, benzoin phenyl ether, and benzoin acetate; acetophenones, e.g., acetophenone, 2,2-dimethoxyacetophenone, and 1,1-dichloroacetophenone, benzil, benzil ketals, e.g., benzil dimethylketal and benzil diethyl ketal; anthraquinones, e.g., 2-methylanthraquinone, 2-ethylailthraquinone, 2-tertbutyl-anthraquinone, 1-chloro-anthraquinone and 2-amylanthra-quinone; triphenylphosphine oxides; benzoyl-phosphine oxides, e.g., 2,4, 6-trimethylbenzoy-diphenylphosphine oxide; bisacylphosphine oxides; benzophenones, e.g., benzophenone and 4,4'-bis(N,N'-dimethyl-amino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone;

1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone. In a preferred embodiment of the present invention the free radical photoinitiator is (2,4,6-trimethylbenzoyl)-diphenylphosphine oxide (e.g. TPO from Sigma Aldrich). In another embodiment of the present invention the free radical photoinitiator is a blend of bisacylphosphine oxide and 1-hydroxycyclohexyl phenyl ketone.

In order to get sufficient adhesion between the layers, the surface layer cannot be completely cured during the additive manufacturing process. Additives that absorb light are called light blockers and are used to control the penetration depth of the light, in other words the curing thickness of the printed layers of the three-dimensional object. Light blockers can be colorants such as pigments, UV blockers or fluorescent agents/optical brightener. Colorants and UV blockers typically absorb the light and do not retransmit light. Fluorescent agents/optical brighteners absorb light and omit light at a different frequency. High performance clear printed objects can be achieved by using additives which act as both light blocker and brightener.

The photopolymer composition of the present invention comprises at least one UV blocker d), preferably in an amount of 0.1-1% by weight, based on the total weight of the photopolymer composition. Examples of different UV blockers are benzotriazoles, benzophenones, and triazines, benzotriazole-phenoler, and compounds such as bisoctriazole, butylated hydroxytoluene, tris(2,4-di-tert-butylphenyl) phosphite, 4-aminobenzoic acid, ethyl cinnamate, 2-ethylhexyl salicylate, ethylhexyl triazone, hexyl-2-[4-(diethylamino)-2-hydroxybenzoyl]-benzoate, 2-hydroxy-4-methoxybenzophenone, oxy-benzone, 5-phenyl-benzimidazole-4-6-disulphonic acid and 2,2'-(2,5-thiophenediyl)bis(5-tert-butylbenzoxazole) (e.g. OB+ from Mayzo)). In a preferred embodiment of the present invention the UV blocker is 2-hydroxy-4-methoxybenzophenone (e.g. Speedblock UV-9 from Lambson).

After the additive manufacturing process the uncured composition needs to be removed from the surface and the remaining composition cured to a higher rate in order to reach optimal mechanical performance. The uncured liquid composition on the surface of the three-dimensional object is usually removed by washing with solvent and the additive manufactured three-dimensional object is completely cured in a UV-oven. Support structure is usually removed before post curing.

The photopolymer composition of the present invention further comprises at least one cationic photoinitiator e), in an amount of 0.1-5% by weight, preferably 0.1-2% by weight based on the total weight of the photopolymer composition. The cationic photoinitiator may be chosen from any commonly used to initiate cationic photopolymerization. Examples include onium salts with anions of weak nucleophilicity, e.g., iodonium salts, sulphonium salts, halonium salts, sulphoxonium salts, or diazonium salts. Metallocene salts are also suitable as photoinitiators. In a preferred embodiment of the present invention the cationic photoinitiator is bis(4-tert-butylphenyl)iodonium hexafluoro-phosphate (e.g. Speedcure 938 from Lambson).

Furthermore the photopolymer composition of the present invention may comprise a cationic photosensitiser f), to increase the sensitivity of the photopolymer composition by increasing the reactivity of the cationic photoinitiator and thereby ensuring efficient light absorption. The photosensitiser is present in an amount of 0-1% by weight, preferably 0.01-0.5% by weight based on the total weight of the photopolymer composition. The nature of a suitable photosensitiser depends on the photoinitiator and its capability to absorb light. Iodonium salts for example usually need help from a sensitiser, preferably anthracene or thioxanthone. Commonly used photosensitisers are for instance pyrene, n-phenyl glycine, anthracene and thioxanthone and their derivatives, such as 1-chloro-4-propoxy-thioxanthone. In a preferred embodiment of the present invention the cationic photosensitiser is 1,3-di[[α-[1-chloro-9-oxo-9H-thioxanthen-4-yl)oxy]acetylpoly[oxy(1-methylethylene)]]oxy]-2,2-bis[[α-[1-cloro-9-oxo-9H-thioxanthen-4-yl)oxy]acetylpoly[oxy(1-methylethylene)]]oxymethyl-propane (e.g. Speedcure 7010 from Lambson). If no photosensitiser is used the amount of cationically curable component of the photopolymer composition could be increased, but the additive manufactured object is then very soft.

In one embodiment, a thermal initiator g), is added to the photopolymer composition of the invention in order to be able to perform a dual cure post-treatment of the printed three-dimensional object. Dual cure is a combination of UV curing and thermal curing. The additive manufactured three-dimensional object is post-cured in an UV-oven and a thermal oven. The effect is the same whether the UV irradiation is followed by thermal treatment or the thermal treatment is followed by UV irradiation of the three-dimensional printed object. The thermal initiator is chosen very carefully to avoid thermal degradation in the preparation and the printing phase. The thermal initiator is selected from the group of benzoyl peroxide, dicumyl peroxide and azobisisobutyronitrile (AIBN). Preferably the thermal initiator is benzoyl peroxide.

Additionally, the photopolymer composition of the present invention may include other components, for example, stabilizers, modifiers, tougheners, antifoaming agents, levelling agents, thickening agents, flame retardants, antioxidants, pigments, dyes, fillers, and combinations thereof. The present invention is further explained with reference to enclosed embodiment Examples, which are to be construed as illustrative and not limiting in any way.

EXAMPLES

The examples illustrate embodiments of the photopolymer compositions for additive manufacturing. Table 1 describes the components of the photopolymer compositions illustrated in Table 2 and Table 3.

TABLE 1

| Trade Name | CAS No | Chemical Name | Function | Supplier |
|---|---|---|---|---|
| SR 399 | 60506-81-2 | Dipentaerythritol hexaacrylate | Free radically curable component | Sartomer (Arkema group) |
| SR 295 | 4986-89-4 | Pentaerythritol tetraacrylate | Free radically curable component | Sartomer (Arkema group) |
| MVG | 5837-73-0 | Methyl vinyl glycolate | Free radically curable reactive diluent | Sigma Aldrich |
| SR 454 | 28961-43-5 | Ethoxylated trimethylolpropane triacrylate | Free radically curable component | Sartomer (Arkema group) |

TABLE 1-continued

| Trade Name | CAS No | Chemical Name | Function | Supplier |
|---|---|---|---|---|
| CN998B80 | N.A. | Aliphatic polyester urethane triacrylate oligomer diluted with 20% 1,6 hexanediol diacrylate (HDDA) | Free radically curable component | Sartomer (Arkema group) |
| EBECRYL ® 265 | 151030-88-5 | Aliphatic urethane triacrylate oligomer diluted with 25% of tripropylene glycol diacrylate monomer | Free radically curable component | Allnex |
| TPO | 75980-60-8 | (2,4,6-Trimethylbenzoyl)-diphenylphosphine oxide | Free radical photoinitiator | Sigma Aldrich |
| Speedblock UV-9 | 131-57-7 | 2-Hydroxy-4-methoxybenzophenone | UV blocker | Lambson |
| UviCure S105 | 2386-87-0 | 3,4-Epoxycyclohexylmethyl 3',4'-epoxycyclohexanecarboxylate | Cationic curable monomer | Lambson |
| Curalite ™Ox | 3047-32-3 | 3-Ethyl-3-hydroxymethyl-oxetane; monooxetane; TMPO | Reactive diluent | Perstorp AB |
| Curalite ™OxPlus | 18934-00-4 | 3,3'-Oxydimethylene-bis(3-ethyl)-oxetane; dioxetane; di-TMPO | Reactive diluent | Perstorp AB |
| Speedcure 938 | 61358-25-6 | Bis(4-tert-butylphenyl)iodonium hexafluorophosphate | Cationic photoinitiator | Lambson |
| Speedcure 7010 | 1003567-83-6 | 1,3-Di[[α-[1-chloro-9-oxo-9H-thioxanthen-4-yl)oxy]acetylpoly[oxy(1-methylethylene)]]oxy]-2,2-bis[[α-[1-cloro-9-oxo-9H-thioxanthen-4-yl)oxy]acetylpoly[oxy(1-methylethylene)]]oxymethylpropane | Cationic photo sensitiser | Lambson |
| Capa ™ 6500 | 24980-41-4 | 2-Oxepanone, homopolymer (50 000 Mw) | Toughener | Perstorp AB |

TABLE 2

| Composition | Comparative Ex. 1 | Ex. 2 | Ex. 3 | Ex. 4 |
|---|---|---|---|---|
| Free radically curable compound: | | | | |
| SR 454 | 47.1 | 46.4 | 46.4 | 46.4 |
| EB 265 | 39.0 | 39.0 | 39.0 | 39.0 |
| TPO | 0.4 | 0.4 | 0.4 | 0.4 |
| Speedblock UV 9 | 0.2 | 0.2 | 0.2 | 0.2 |
| Cationically curable compound: | | | | |
| ECC | 10.9 | 10.9 | 10.9 | 10.9 |
| Curalite ™Ox | 1.0 | 0.5 | 1.0 | 1.5 |
| Curalite ™OxPlus | 1.0 | 1.5 | 1.0 | 0.5 |
| Capa ™ 6500 | 0 | 0.7 | 0.7 | 0.7 |
| Speedcure 938 | 0.3 | 0.3 | 0.3 | 0.3 |
| Speedcure 7010 | 0.07 | 0.07 | 0.07 | 0.07 |
| Total % by weight | 100 | 100 | 100 | 100 |
| Viscosity at 23° C. (Pa · s) | 1.0 | 1.3 | 1.5 | 1.5 |
| Cured additive manufactured object | | | | |
| Monooxetane:dioxetane ratio | 1:1 | 1:3 | 1:1 | 3:1 |
| impact energy[1] (kJ/m$^2$) | 3 | 8 | 8 | 13 |
| Impact energy[2] (J/m) | 26 | 67 | 66 | 103 |
| HDT at 0.45 MPa (° C.) | 42 | 42 | 42 | 42 |

TABLE 3

| Composition | Ex. 5 | Ex. 6 |
|---|---|---|
| Free radically curable compound: | | |
| SR 399 | 7 | 7 |
| SR 295 | 2 | 2 |
| MVG | 0 | 2.5 |
| SR 454 | 44.7 | 42.2 |
| CN998B80 | 30 | 30 |
| EB 265 | 0 | 0 |

TABLE 3-continued

| Composition | Ex. 5 | Ex. 6 |
|---|---|---|
| TPO | 0.4 | 0.4 |
| Speedblock UV 9 | 0.45 | 0.45 |
| Cationically curable compound: | | |
| ECC | 10 | 10 |
| Curalite ™Ox | 1.5 | 1.5 |
| Curalite ™OxPlus | 0.5 | 0.5 |
| Capa ™ 6500 | 0.5 | 0.7 |
| Speedcure 938 | 0.3 | 0.3 |
| Speedcure 7010 | 0.075 | 0.075 |
| Total % by weight | 100 | 100 |
| Viscosity at 23° C. (Pa · s) | 0.8 | 0.7 |
| Cured additive manufactured object | | |
| Monooxetane:dioxetane ratio | 3:1 | 3:1 |
| Impact energy$^1$ (kJ/m$^2$) | 1 | 5.7 |
| Impact energy$^2$ (J/m) | 12 | 50.79 |
| HDT at 0.45 MPa (° C.) | 66 | — |
| Tensile strength (MPa) | 5.2 | 9.1 |
| Elongation at break (%) | 0.9 | 2.7 |

The photopolymer compositions of Example 1-6 in Table 2 were prepared. A powder version of Capa™ 6500 was blended with the other components of the cationic compound. The cationically curable components and the free radically curable components were blended separately and the photoinitiators were mixed into their respective formulations at 60-80° C. for 15 min. The cationically curable formulation and the free radically curable formulation were then mixed together with a magnetic stirrer at 30° C. for 2-6 hours and at a ratio of 86:14 of free radically compound to cationic compound. All blending and storing of the components were made in darkness and in dark bottles to avoid activation of the photoinitiators, which are designed to work with additive manufacturing machines at 405 nm and thus are active in visible light.

Viscosity of the prepared photopolymer compositions were measured on a TA rheometer (AR-G2, plate-plate 25 mm) using shear rate sweep up and down in the interval of 0.5-50 s at 23° C. The compositions were preheated for 15 minutes in an oven at 60° C. and then allowed to cool to room temperature before the measurements. The samples showed shear thinning and thixotropic behaviour. The viscosity values presented in Table 2 are read at a shear rate of 30 s$^{-1}$ from shear sweep down.

The photopolymer compositions of Example 1-4 were heated to 60° C. to ensure complete homogenous formulations before being placed in the resin tray of the DLP machine. Three-dimensional bars were prepared from the photopolymer compositions on an Ember printer from Autodesk with normal settings (405 nm LED, 0.025 mm layer thickness, 8.0 s exposure time on the first layer, 4.0 s exposure time on the following three layers and thereafter 2.0 s exposure time on each layer). The three-dimensional bars were built up diagonally and with a support structure to ensure the very best printing properties. After fabrication, the support structure was removed and the partially cured bars were placed in isopropanol for 5 minutes and then post-cured for 4.5 hours in an UV chamber (LC-3D Print Box from NextDent). The cured bars were then conditioned for 24 hours at 23° C. and 50% relative humidity before the mechanical properties were tested.

The photopolymer compositions of Example 5-6 were treated in the same way as the compositions of Example 1-4 but the three-dimensional bars were prepared on a SLA machine from Formlab, a Formlab 2+ laser printer with normal settings (405 nm laser and 0.05 mm layer thickness). The three-dimensional bars were built up diagonally and with a support structure to ensure the very best printing properties. After fabrication, the support structure was removed and the partially cured bars were placed in isopropanol for 5 minutes and then post-cured in an UV chamber (LC-3D Print Box from NextDent). The bars printed from the formulation of Example 5 only needed 1.5 hours post-curing time, while the bars printed from the formulation of Example 6 was post-cured in about 4.5 hours. The cured bars were then conditioned for 24 hours at 23° C. and 50% relative humidity before the mechanical properties were tested.

Impact resistance of the cured bars were measured by the Izod Impact Test according to ISO 180/A, where the impact energy was measured on a notched sample. The result is reported in Table 2 and 3 both as impact energy$^1$: energy lost per unit cross-sectional area at the notch (kJ/m$^2$) and as Impact energy$^2$: energy lost per unit of thickness (J/m) at the notch (an alternative expression of the same result).

Heat deflection temperature (HDT) of the cured bars were measured according to ISO 75 (method B, using a flexural stress of 0.45 MPa) and the results are presented in Table 2 and 3. HDT is the temperature at which the cured object deforms under a specified load and indicates if a material is suitable for high temperature applications.

Tensile strength and elongation at break of the cured dogbones were measured according to ISO 527 (load 0.2 N, test speed 50 mm/min, equipment Zwick/Roell tensile machine) and the results are presented in Table 3.

The results of the measurements show that the impact resistance of the additive manufactured bars is greatly improved by the addition of a small amount of thermoplastic polycaprolactone to the cationically curable compound of the photopolymer composition. An increased amount of monooxetane in relation to the amount of polyoxetane also increases the impact resistance. All of the additive manufactured bars from the exemplified photopolymer compositions have an acceptable HDT value.

The results also show that with the addition of small amounts of pentaerythritol tetraacrylate and dipentaerythritol hexaacrylate to the photopolymer composition (Example 5), it is possible to achieve a good build-up and fine details of the printing object with a post curing time of only 1.5 hours. Decreased amounts of the urethane triacrylate also helped lowering the viscosity and enhancing the details of the printed object. The three-dimensional objects printed from the formulation of Example 5 also have a good HDT, which makes the material suitable for high temperature applications.

The addition of methyl vinyl glycolate to the photopolymer composition has shown to decrease the viscosity of the photopolymer composition (Example 6) and to contribute to a great build-up of the three-dimensional objects, flexible printed objects with really fine details, low colour, ok impact strength and enhanced tensile strength and elongation at break.

The invention claimed is:
1. A hybrid photopolymer composition for additive manufacturing comprising:
 a) 50-95% by weight of a free radically curable component comprising at least one (meth)acrylate monomer or oligomer,
 b) 5-49% by weight of a cationically curable component comprising:

b1) a cycloaliphatic epoxide,
b2) an oxetane mixture comprising:
   i. a monooxetane compound, having one oxetane group, and
   ii. a polyoxetane compound, having at least two oxetane groups, and
b3) a thermoplastic polycaprolactone with a weight average molecular weight of 20,000-100,000 g/mol,
c) a free radical photoinitiator,
d) a UV blocker,
e) a cationic photoinitiator,
f) optionally, a cationic photosensitiser, and
g) optionally, a thermal initiator,
   wherein the percent by weight is based on the total weight of the photopolymer composition.

2. A photopolymer composition according to claim 1, wherein said (meth)acrylate monomer is hexanediol di(meth)acrylate, trimethylolpropane tri(meth)acrylate, pentaeryhtritol tri(meth)acrylate, pentaeryhtritol tetra(meth)acrylate, dipentaerythritol penta(meth)acrylate, dipentaerythritol hexa(meth)acrylate, alkylene oxide modified glycerol tri(meth)acrylate, alkylene oxide modified neopentyl glycol di(meth)acrylate, alkylene oxide modified trimethylolpropane tri(meth)acrylate, alkylene oxide modified pentaeryhtritol tetra(meth)acrylate and/or ditrimethylolpropane tetra(meth)acrylate.

3. A photopolymer composition according to claim 1, wherein said (meth)acrylate monomer is ethoxylated trimethylolpropane triacrylate, pentaerythritol tetraacrylate and/or dipentaerythritol hexaacrylate.

4. A photopolymer composition according to claim 1, wherein said (meth)acrylate oligomer is an epoxy (meth)acrylate, a polyester (meth)acrylate, a polyether (meth)acrylate, a melamine (meth)acrylate, an urethane (meth)acrylate, a polycarbonate (meth)acrylate, a dendritic (meth)acrylate and/or an unsaturated polyester.

5. A photopolymer composition according to claim 1, wherein said (meth)acrylate oligomer is an aliphatic polyester urethane triacrylate oligomer, diluted with 20% 1,6-hexanediol diacrylate (HDDA).

6. A photopolymer composition according to claim 1, wherein said free radically curable component a) additionally comprises a 2-hydroxy-3-butenoic acid and/or at least one ester of 2-hydroxy-3-butenoic acid.

7. A photopolymer composition according to claim 6, wherein said ester of 2-hydroxy-3-butenoic acid is a methyl or ethyl ester.

8. A photopolymer composition according to claim 7, wherein said methyl or ethyl ester is methyl vinyl glycolate or ethyl vinyl glycolate.

9. A photopolymer composition according to claim 1, wherein said free radically curable component a) additionally comprises an oligomer or polymer obtained by reacting at least one monomeric, oligomeric or polymeric isocyanate having two or more isocyanate groups with 2-hydroxy-3-butenoic acid and/or at least one alkyl ester of 2-hydroxy-3-butenoic acid.

10. A photopolymer composition according to claim 9, wherein said ester of 2-hydroxy-3-butenoic acid is a methyl or ethyl ester.

11. A photopolymer composition according to claim 10, wherein said methyl or ethyl ester is methyl vinyl glycolate or ethyl vinyl glycolate.

12. A photopolymer composition according to claim 1, wherein said cycloaliphatic epoxide is a 4-epoxycyclohexylmethyl-3,4-epoxycyclohexane carboxylate, a 3,4-epoxy-1-methyl-cyclohexyl methyl-3,4-epoxy-1-methylcyclohexane carboxylate, a 6-methyl-3,4-epoxycyclohexymethyl-6-methyl-3,4-epoxy-cyclohexane carboxylate, a 3,4-epoxy-3-methylcyclohexylmethyl-3,4-epoxy-3-methylcyclohexane carboxylate and/or a 3,4-epoxy-5-methylcyclohexylmethyl-3,4-epoxy-5-methylcyclohexane carboxylate.

13. A photopolymer composition according to claim 1, wherein said monooxetane (i) is 3-ethyl-3-hydroxymethyl-oxetane and said polyoxetane (ii) is 3,3'-oxydimethylene-bis(3-ethyl)-oxetane.

14. A photopolymer composition according to claim 1, wherein said thermoplastic polycaprolactone b3) is present in an amount of 1-10% by weight based on the weight of the cationically curable component b).

15. A photopolymer composition according to claim 1, wherein said thermoplastic polycaprolactone b3) is present in an amount of 2.5-7.5% by weight based on the weight of the cationically curable component b).

16. A photopolymer composition according to claim 1, wherein graphene is present in an amount of 0-5% by weight, based on the total weight of the photopolymer composition.

17. A photopolymer composition according to claim 1, wherein said free radical photoinitiator c) is benzoin or a benzoin derivative, acetophenone, benzil or a benzil ketal, an anthraquinone, a triphenylphosphine oxide, a benzoylphosphine oxide, bisacylphosphine oxide, a benzophenone, a thioxanthone, a xanthone, an acridine derivative, aphenazene derivative, a quinoxaline derivative, 1-phenyl-1,2-propanedione 2-O-benzoyl oxime, 4-(2-hydroxyethoxy)phenyl-(2-propyl)ketone, 1-aminophenyl ketone and/or 1-hydroxy phenyl ketone.

18. A photopolymer composition according to claim 1, wherein said cationic photoinitiator e) is an iodonium, a sulphonium, a halonium, a sulphoxonium, a diazonium and/or a metallocene salt.

19. A photopolymer composition according to claim 1, wherein said thermal initiator g) is selected from the group of benzoyl peroxide, dicumyl peroxide and azobisisobutyronitrile (AIBN).

20. A three-dimensional object obtained through additive manufacturing using the photopolymer composition according to claim 1.

* * * * *